(12) United States Patent
Zeng et al.

(10) Patent No.: US 8,472,196 B2
(45) Date of Patent: Jun. 25, 2013

(54) POWER MODULE

(75) Inventors: Jian-Hong Zeng, Taoyuan Hsien (TW);
Shou-Yu Hong, Taoyuan Hsien (TW);
Qi-Feng Ye, Taoyuan Hsien (TW);
Yi-Cheng Lin, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 181 days.

(21) Appl. No.: 13/049,322

(22) Filed: Mar. 16, 2011

(65) Prior Publication Data

US 2012/0014069 A1    Jan. 19, 2012

(30) Foreign Application Priority Data

Jul. 15, 2010    (CN) .......................... 2010 1 0230160

(51) Int. Cl.
*H05K 7/20* (2006.01)
*H05K 13/04* (2006.01)
*H05K 3/34* (2006.01)

(52) U.S. Cl.
USPC ................. 361/718; 361/679.46; 361/679.54; 361/704; 361/707; 361/709; 361/715; 361/762; 257/670; 257/676; 257/723; 257/724; 257/783; 257/786

(58) Field of Classification Search
USPC ............... 361/679.46, 679.54, 690, 704–712, 361/715–722, 730, 760, 763, 781; 165/80.3, 165/104.33, 185; 257/685, 778, 690, 666, 257/676, 691, 679, 706, 787, 713, 718–727; 438/106–113, 123, 124; 174/16.3, 252; 29/825, 29/830, 831, 832, 836, 838, 840, 841, 842, 29/846, 848

See application file for complete search history.

(56) References Cited

U.S. PATENT DOCUMENTS

| | | | | |
|---|---|---|---|---|
| 4,924,296 | A | * | 5/1990 | Cini et al. ..................... 257/786 |
| 5,049,973 | A | * | 9/1991 | Satriano et al. ............... 257/670 |
| 5,353,498 | A | * | 10/1994 | Fillion et al. .................... 29/840 |
| 5,438,021 | A | * | 8/1995 | Tagawa et al. ................. 438/107 |
| 5,767,573 | A | * | 6/1998 | Noda et al. ..................... 257/675 |
| 6,137,165 | A | * | 10/2000 | Thierry .......................... 257/690 |
| 6,205,010 | B1 | * | 3/2001 | Ohsaka et al. ................ 361/103 |
| 6,257,215 | B1 | * | 7/2001 | Kaminaga et al. ............ 123/647 |

(Continued)

FOREIGN PATENT DOCUMENTS

| | | | |
|---|---|---|---|
| CN | 101496163 A | | 7/2009 |
| JP | 409208668 A | * | 8/1997 |
| JP | 02005146229 A | * | 6/2005 |

*Primary Examiner* — Michail V Datskovskiy
(74) *Attorney, Agent, or Firm* — Muncy, Geissler, Olds & Lowe, PLLC

(57) ABSTRACT

A power module includes a first heat sink, first and second power chips, a thermo-conductive insulating layer, a lead frame and a molding compound. The first heat sink has a first area and a second area. The first power chip is disposed in the first area. The thermo-conductive insulating layer is disposed in the second area. The second power chip is disposed on the heat sink through the thermo-conductive insulating layer. The lead frame is electrically connected to at least one of the first and second power chips. The molding compound covers the first and second power chips, the thermo-conductive insulating layer and a portion of the lead frame. The first heat sink is electrically connected to at least one of the first and second power chips. Because the first power chip is not disposed on the first heat sink through the thermo-conductive insulating layer, the cost can be reduced.

27 Claims, 12 Drawing Sheets

U.S. PATENT DOCUMENTS

| | | | |
|---|---|---|---|
| 6,313,520 B1* | 11/2001 | Yoshida et al. | 257/676 |
| 6,735,065 B2* | 5/2004 | Graf et al. | 361/103 |
| 6,756,689 B2* | 6/2004 | Nam et al. | 257/783 |
| 7,042,085 B2* | 5/2006 | Wolf et al. | 257/724 |
| 7,847,375 B2* | 12/2010 | Mahler et al. | 257/666 |
| 7,868,465 B2* | 1/2011 | Otremba et al. | 257/783 |
| 2002/0167065 A1* | 11/2002 | Graf et al. | 257/467 |
| 2003/0102489 A1* | 6/2003 | Nam et al. | 257/177 |
| 2004/0061221 A1* | 4/2004 | Schaffer | 257/723 |
| 2006/0074150 A1* | 4/2006 | Ikezawa et al. | 523/400 |
| 2007/0045823 A1* | 3/2007 | Miller | 257/706 |
| 2009/0140369 A1* | 6/2009 | Lee | 257/467 |
| 2009/0152714 A1* | 6/2009 | Yamagishi et al. | 257/724 |
| 2009/0194859 A1* | 8/2009 | Kang et al. | 257/676 |
| 2010/0140786 A1* | 6/2010 | Lee et al. | 257/693 |

* cited by examiner

POWER MODULE

CROSS REFERENCE TO RELATED APPLICATIONS

This Non-provisional application claims priority under 35 U.S.C. §119(a) on Patent Application No(s). 201010230160.7 filed in People's Republic of China on Jul. 15, 2010, the entire contents of which are hereby incorporated by reference.

BACKGROUND OF THE INVENTION

1. Field of Invention

The invention relates to a power module, and more particularly to a power module applied to a power converter.

2. Related Art

There are more kinds of power converters due to different applications of the power converters. The power converters may be classified into a non-isolated AC/DC power converter, a non-isolated DC/DC power converter, an isolated DC/DC converter, an isolated AC/DC power converter and DC/AC, AC/AC power converters according to the type of the electric energy being converted. The non-isolated AC/DC power converter is, for example, composed of an AC/DC conversion circuit for a power factor correction (hereinafter referred to as PFC) circuit. The isolated AC/DC power converter is composed of one PFC circuit and one or multiple DC/DC converters. Because the electric energy properties to be converted and the conversion levels are different, the power densities and efficiencies, which can be easily achieved by various converters, are not always the same. Taking the isolated AC/DC power converter as an example, the general industrial power density is 10 W/inch$^3$, and the efficiency is about 90%. The non-isolated AC/DC power converter, the isolated DC/DC converter and the DC/AC power converter have the higher efficiencies and power densities.

The high efficiency of the power converter represents the low energy consumption. If the efficiency is 90%, the converted energy consumption is equal to about 10% of the total input energy of the power converter. If the power converter has the efficiency of 91%, its converted energy consumption is reduced to 9% of the total input energy. That is, when the efficiency is increased by one point, the energy consumption is reduced by 10% as compared with the power converter with the efficiency of 90%, and the improvement is very considerable. In fact, the efforts on the efficiency improvement of the power converter are often proceeded with the order of magnitude equal to 0.5% or even 0.1%.

The energy consumption of the power converter is mainly composed of the on-state loss and the switch loss, especially the switch loss of the active device. The switch loss is more significantly affected by the working frequency. The power converter, especially the switch power converter, has the working frequency usually higher than 20 kHz in order to decrease the audio noise. The selection of the actual working frequency of the power converter is more significantly affected by the inactive device, especially the magnetic element. If the magnetic element has the small size, the high frequency is usually needed to decrease the magnetic flux density of the working element in order to achieve the reliable work. Thus, the high switch loss is induced. Alternatively, the wire diameter of the wire set and the number of loops in the magnetic element can be increased so that the on-state loss is increased and the high loss is further induced. On the contrary, if the magnetic element has the large size, the working frequency can be lowered under the precondition of assuring the reliable work, and the switch loss is thus decreased. Also, the wire diameter of the wire set and the number of loops in the magnetic element may be decreased, so that the on-state loss is decreased, the total loss is decreased and the high efficiency is obtained.

Therefore, it is easy to understand that one of the key factors of obtaining the high power density or the high efficiency is to enhance the space availability inside the power converter. As the space availability gets higher, the larger space for the inactive device, especially the magnetic element, which is very important to the power converting efficiency, is left. Thus, the large-size inactive element can be easily used so that the power efficiency is increased. Also, the total power of the power source can be increased by using the large-size inactive device, so that the power density of the power converter can be enhanced. Thus, for the high power space availability, the high efficiency can be achieved more easily under the specific power density, or the high power density can be achieved more easily under the specific efficiency, and it is possible to possess both the high power density and the high efficiency concurrently.

The semiconductor device is one of the important factors for determining the efficiency of the power converter. However, the use of the semiconductor device tends to unavoidably need to use the additional materials, such as the package material for protecting the semiconductor, the heat sink for heat dissipating, the fixture for fixing the semiconductor device, and the like, which are not useful to the power converting efficiency. As the ratio of these materials to the power converter gets greater, the internal space availability of the power converter gets worse. At present, the excellent product has well utilized the internal space of the power converter. As a result, the ratio of the space, occupied by the power semiconductor device, to the total size of the power converter gets larger and larger, and gets more and more emphasized.

At present, many advanced techniques in the industry have been disclosed. For example, the heat sink is optimized, and the mounting is simplified to reduce the space occupied by the heat sink and the space for mounting. For example, a new insulation washer technique is provided, and a screw and a fixture are eliminated to reduce the size and improve the design of the power converter.

In order to enhance the power performance, the space availability has to be continuously enhanced. The package space availability of the semiconductor device becomes a bottleneck. For an integrated power module (IPM), many semiconductor devices are integrated within a device package to provide a possibility for the enhancement of the space availability within the package. The integrated modules have different integrated contents because the applications are different. One single power semiconductor device and its controller or driver may be integrated together. Multiple power semiconductor devices may be integrated together. Many semiconductor devices and their corresponding controllers or drivers may be integrated together. The different integrated contents cause different consideration points and difficulty levels. For the sake of distinguishing, the power module mentioned hereinbelow includes two power chips to emphasize the integration of multiple power chips.

The power module with the integrated power device may further be integrated with some controlling and driving devices in some occasions. The frequently used power chips include the MOSFET, IGBT, the power diode and the like. The controlling and driving elements often include a few transistors, ICs, passive devices and like. Because multiple devices are integrated as one device, the power module has the advantages including the convenient usage and the long time without fault, and is widely applied to various occasions. Because the power module has many power chips integrated together, the generated heat is high and the power chips are distributed in many points. The thermal management thereof thus becomes very important. Among many existing arts, the heat dissipating ability is optimized.

In a first existing art, an internal cross-sectional view of a typical power module 30 is as shown in FIG. 1. Element devices 32 and 34 and a lead frame 35 are assembled in the existing art. Taking some chips 32, 34 of the power chip as an example, its front-side electrode can be electrically connected to the lead frame through wire bonding, copper strap bonding, or the like, and its backside can be electrically and/or mechanically connected the pin-frame through strap bonding, silver paste, sintering, epoxy adhesive or the like. After the element device and the lead frame are assembled, the areas to be protected are covered by a molding compound 36 so that the mechanical, dustproof, moisture-proof, insulation protection functions may be achieved. This structure has the advantage of the low price.

In the existing art, the heat dissipating surface insulated by the molding compound plays the role of the mechanical protection at the same time. So, the thickness thereof is thicker, and is usually greater than 0.5 mm. In general, the thermal conductivity of the molding compound is about 1 W/m·K. The thermal conductivity from the chip surface to the case is calculated as follows:

$$R = \frac{\text{Thermal conducting distance}}{\text{Thermal conductivity} \times \text{area}} = \frac{t \text{ (mm)}}{k(w/m \cdot k) \times A \text{ (mm}^2)} \times 100$$

For the area with the size of 10 mm by 10 mm and the thickness of 0.5 mm, if the thermal conductivity of the molding compound is 1 W/m·K, the thermal resistance can reach as high as 5 K/W. As a result, the package usually has the worse heat dissipating performance. That is, the thermal resistance (Rjc) from the junction of the chip to the case is greater in the example of the power semiconductor device. In addition, because the molding compound has the smaller coefficient of heat conductivity, its transversal thermal diffusing ability is also lower. Thus, the heat concentration spot (hot spot) tends to occur, thereby decreasing the device reliability and lifetime.

Therefore, the first existing art has the poor heat dissipating ability, and is not suitable for the occasion requiring the high heat dissipating ability. In order to optimize the performance of the power module, many techniques have been further proposed.

In a second existing art, as shown in FIG. 2, a heat sink 31 is added to one side of the molding based on the first existing art. Because the heat sink has the higher thermal conductivity (e.g., the thermal conductivity of the copper is higher than 300 W/m·K), the average temperature performance of the module is increased and the problem of the hot spot can be eased by a predetermined level so that the thermal management ability of the module is increased. However, the heat sink is usually requested to be electro-insulated, the molding compound 36 is usually filled in between the wire frame 35 and the heat sink. Due to the limitation of the molding technique, the thickness of the molding compound layer is typically greater than 0.2 mm, usually greater than 0.3 mm. According to the calculating method of the first existing art, the thermal resistance corresponding to the 10 mm×10 mm area is about 3K/W. That is, although the overall heat dissipating performance of this structure is improved, the performance thereof is still poor.

In a third existing art, as shown in FIG. 3, a circuit pattern is formed on a direct bonded copper (DCB) ceramic substrate 31a, which serves as a mounting carrier of the element devices. The element devices 32 and 34 are assembled with the DBC ceramic substrate. For a portion of the semiconductor chip, the wire bonding technique has to be adopted to accomplish the electrical signal connections between the front-side electrodes of the semiconductor chips 32 and 34 and the DBC substrate/lead frame 35. The essence of the structure is based on the second existing art, and adopts the ceramic medium layer with the higher heat conductance coefficient to replace the molding compound layer. Because the frequently used aluminum-oxide ceramic has the coefficient of heat conductivity equal to about 24 W/m·K, which is a great improvement with respect to 1 W/m·K of the molding compound. For the DBC substrate with the 10 mm-by-10 mm area (the ceramic thickness is 0.38 mm, and the copper layers on two sides have the thickness of 0.3 mm), its thermal resistance is 0.17K/W, which is relatively enhanced with respect to 5K/W in the first existing art, and the reduction is higher than 90%.

However, all the element devices 32 and 34 need to be mounted on the DBC substrate, so the required area of the DBC carrier is larger, and the price of the DBC substrate is higher, so that the cost is higher. Because the production technique of the DBC substrate is the high-temperature sintering, the DCB substrate is the product with the high energy consumption, and the use of the large area DBC substrate cannot satisfy the technological progressing trend of the current green environment protection. In addition, the aluminum oxide has the coefficient of heat conductivity equal to about 24 W/m·K, which has been improved as compared with that of the molding compound (usually lower than 1 W/m·K). However, compared with metal (e.g., the copper with the coefficient equal to about 300 W/m·K), the coefficient difference therebetween is still very large so that the transversal heat diffusion ability is not good enough, and the poor thermal uniformity tends to occur. Thus, the heat dissipating performance still can be further enhanced.

In a fourth existing art, as shown in FIG. 4, this structure is improved based on the third existing art, wherein a heat sink 31b is further assembled to the other side of the element device 31a opposite the side where the DBC substrate is assembled. This can enhance the average temperature performance of the module. However, due to the application of the large-area DBC substrate, the warpage, induced by the mismatch between the coefficients of thermal expansion (CTEs) of the DBC substrate, the heat sink 31b and the molding compound 36, may be larger, thereby decreasing the reliability. If the DBC substrate has the too-large dimension, and the DBC substrate and the heat sink 31b are generally soldered together, the defect of too many bubbles in the solder layer may occur. In addition, the problem of the high cost still cannot be solved.

In a fifth existing art, as shown in FIG. 5, a controller or a driver is integrated with the fourth existing art. Because the controller and the driver itself have the energy consumption that is not high, and are more sensitive to the temperature, they are usually designed to be thermally insulated from the material with the higher temperature. In the existing art, the controller 38 or the driver portion serves as one unit (integrated through the PCB substrate or IC), which is connected to the heat sink 31a through a thermally insulated body (the thermally insulated body made of a PCB, a molding material or a dedicated filler, which usually has the coefficient of heat conductivity smaller than 1 W/m·K). The insulation body is formed by way of adhering or filling, or may be coated on the surface. Thus, the device, such as the controller or driver, having the low self power consumption and being more sensitive to the heat, can be reliably used in the package body and be free from the influence of the high temperature of the power chip, so that it can be integrated into the power module and be reliably used.

As mentioned hereinabove, the current power module has the insulating case under the consideration of the commonality so that the mounting and the selection of the heat sink can be simplified. Similar to the fourth existing art, the case is a good electrical conductor (e.g., copper), which is often designed to be electro-insulated. Thus, the metal material, such as copper, in the module tends to provide the single electroconductive function (lead frame, DBC copper layer) or the single heat dissipating function (copper heat sink). The application of the copper layer providing the electro-conductive property and the function of exchanging the heat with the environment directly is rarely seen. Thus, the potential of the material is not completely discovered, so that the space availability is reduced.

In addition, in order to simply the user in mounting the heat sink, screws or fixtures may be adopted to fix the power module to the heat sink. So, the power module is usually designed to withstand the greater mechanical stress. To ensure the reliable usage, the power module is usually designed to have the thicker molding compound to withstand the greater stress. This increases the thickness and the material cost, and greatly reduces the space availability. In addition, the power module is usually requested to have the higher surface smoothness to reduce the stress induced when the heat sink is mounted, thereby increasing the design cost and the mold cost.

Accordingly, it is obtained that the conventional power modules still have various problems including the poor heat dissipating performance, the material wastage, the difficulty of the reliability design, the electrical performance that cannot be optimized, the over design caused by the over-consideration of the commonality, the economic performance that is not high, or the like. More particularly, the space availability is insufficient and the application popularization in the high power density or the high efficiency occasion is thus restricted.

Thus, the performance of the conventional power module still cannot satisfy the requirement of the high power density or the high efficiency power.

For each semiconductor package, the costs to be invested at the beginning are very high, wherein the costs may include, for example, the mold cost, the manufacturing line building cost and the like. So, if the semiconductor package is requested to have the reasonable price, a lot of products have to support and share the investment at the beginning and further to decrease the manufacturing cost. So, the present power module is frequently used in some occasions with the standard applications. For example, the IGBT three-phase bridge module shown in FIG. 6 is widely applied to the occasions of inverters. The circuits in these occasions are standardized and the requirements thereof are uniform, and the required number of productions is very great. So, the semiconductor factory can provide the standardized packages to be selected by the customers.

In the occasion of the power converter, a power module has been successfully used, as shown in the biphase rectifying bridge of FIG. 7. Because most AC/DC power converters need the input rectifying bridges, a lot of power modules are required. In addition, the rectification circuit is quite standardized, and the semiconductor factory can provide the standardized packages to be selected by the customers.

For the power semiconductor devices in other portions of the power converter, many factories try to provide the power modules, but only a few are popularized. In addition to the insufficient performance of the existing art, another critical reason is that the circuit structure of the power converter is complicated and the power converter cannot be easily standardized. If the power modules are provided according to one circuit design, the cost of the power module is higher because only a few power modules are manufactured. Thus, the application there of is restricted.

In order to enhance the power density or converting efficiency of the power converter, a reasonable solution to the power module with the high space availability and the reasonable cost is required. The existing arts, however, cannot easily satisfy these conditions.

SUMMARY OF THE INVENTION

In view of the foregoing, an objective of the invention is to provide a power module suitable for a power converter to enhance the power density or efficiency, and provides an implementation of the power module supporting the solution. The solution is suitable for the power converter with the power density higher than 15 W/inch$^3$, or the power converter with the highest efficiency higher than 91%, and is particularly suitable for the power converter with the power density greater than 20 W/inch$^3$, or the highest efficiency higher than 93%.

To achieve the above objective, one embodiment of the invention discloses a power module including a first heat sink, a first power chip, a thermo-conductive insulating layer, a second power chip, a lead frame and a molding compound. The first heat sink has a first area and a second area. The first power chip is disposed in the first area. The thermo-conductive insulating layer disposed in the second area has an insulating layer. The second power chip is disposed on the heat sink through the thermo-conductive insulating layer. The lead frame is electrically connected to at least one of the first power chip and the second power chip. The molding compound covers the first power chip, the thermo-conductive insulating layer, the second power chip and a portion of the lead frame. The first heat sink is electrically connected to at least one of the first power chip and the second power chip.

As mentioned hereinabove, the power module of one embodiment of the invention is integrated with a plurality of power chips, so the power density or efficiency can be significantly enhanced. In addition, the first power chip of the invention is not disposed on the heat sink through the thermo-conductive insulating layer, and the thermo-conductive insulating layer can be usually implemented by a thermo-conductive substrate. So, the cost of the thermo-conductive substrate can be reduced. In addition, with the package method and structure of the invention capable of enhancing the power density or efficiency of the power converter, it is possible to obtain the better thermal performance, electric performance, economic performance, EMC performance or the higher reliability as compared with the prior art. The internal space availability of the power module is very high, and the power module can be conveniently used so that the power density or efficiency of the converter can be advantageously enhanced. The invention provides the specific implementation for the power module, which is quite practical and effective. The invention is very suitable for the enhancement of the overall performance of the power converter and the cost effectiveness.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
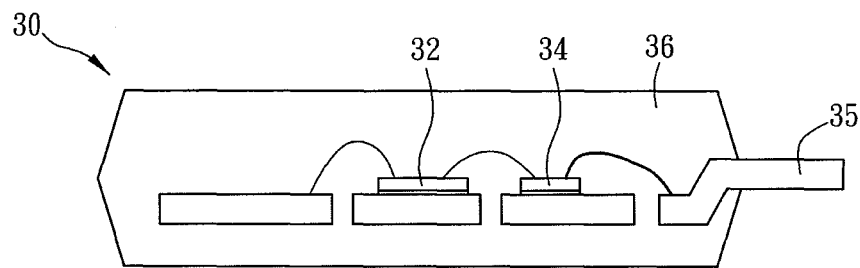
FIGS. 1 to 5 are schematic illustrations showing different aspects of the conventional power module.
Figure 2:
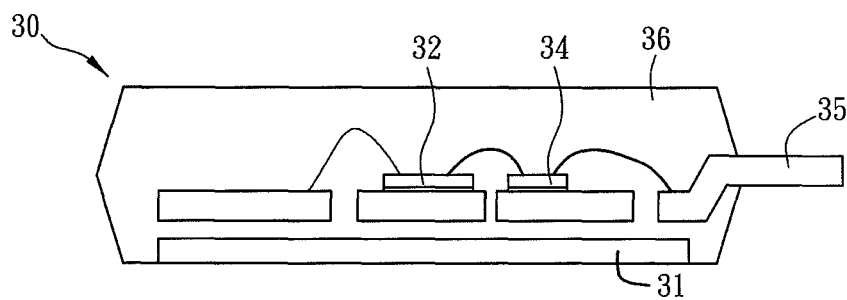
Figure 3:
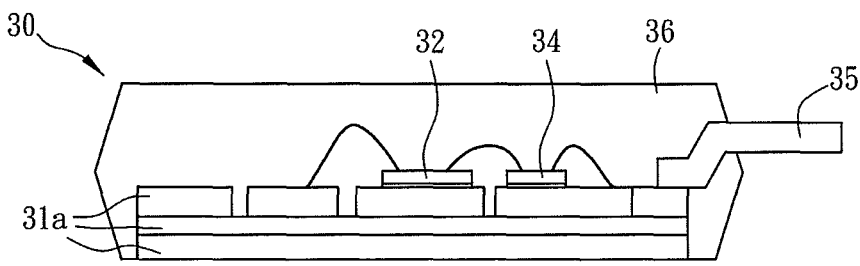
Figure 4:
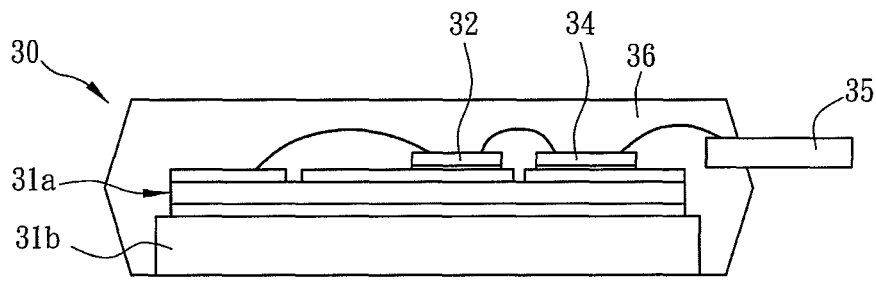
Figure 5:
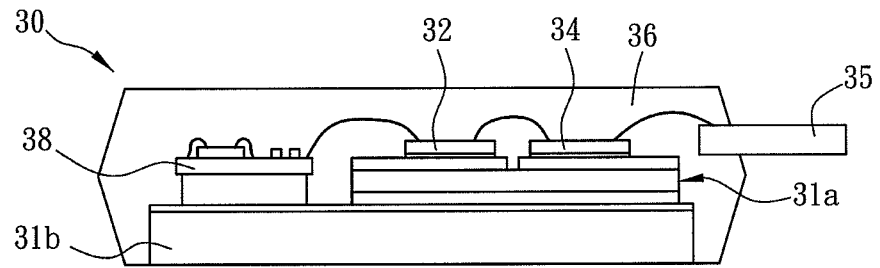
Figure 6:
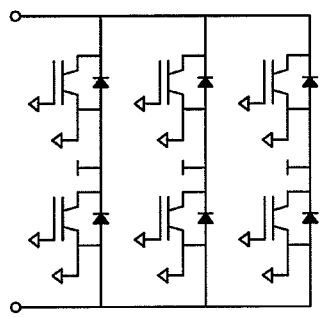
FIG. 6 shows an IGBT three-phase bridge module.
Figure 7:
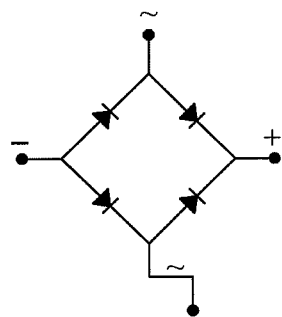
FIG. 7 shows a biphase rectifying bridge.
Figure 8:
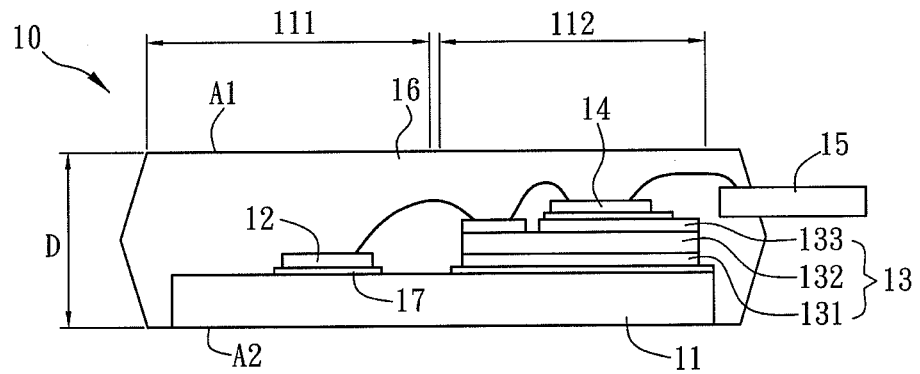
FIG. 8 is a schematic illustration showing a power module according to a preferred embodiment of the invention.

Referring to FIG. 8, a power module 10 according to a preferred embodiment of the invention may be applied to, for example, a power converter or any other device that requires the power to be converted. The power converter may be an AC/DC or a DC/AC converter or an isolated DC/DC converter. If applied to the power converter, the power module 10 may be applied to a power factor correction (PFC) portion, a DC/DC primary side portion (hereinafter referred to as D2D_Pri) or a DC/DC secondary side portion (hereinafter referred to as D2D_Sec) of the power converter.

The power module 10 is a package body, which includes a first heat sink 11, a first power chip 12, a thermo-conductive insulating layer 13, a second power chip 14, a lead frame 15 and a molding compound 16. The first heat sink 11 disposed on a bottom side of the package body has a first area 111 and a second area 112. The first power chip 12 is disposed in the first area 111, and the thermo-conductive insulating layer 13 is disposed in the second area 112. The second power chip 14 is disposed on the thermo-conductive insulating layer 13 and electrically connected to the lead frame 15. The first heat sink 11 is electrically connected to at least one of the first power chip 12 and the second power chip 14. The molding compound 16 covers the first power chip 12, the thermo-conductive insulating layer 13, the second power chip 14 and at least one portion of the lead frame 15, and constitutes a main exterior of the package body.

The first heat sink 11 may be an independent part or may be integrally formed with the lead frame 15, and may be a good conductor, such as copper, for electricity and heat. Herein, the heat sink 11 serves as a carrier for the first power chip 12. The first heat sink 11 may be entirely disposed within the molding compound 16, partially outside the molding compound 16, or entirely outside the molding compound 16.

The first power chip is, for example, a metal-oxide-semiconductor field-effect transistor (MOSFET), which usually has two parallel surfaces including an upper surface and a lower surface. Two electrodes, the source and the gate, are usually disposed on the upper surface, while the drain is the electrode disposed on the lower surface. The lower surface may be directly assembled with the heat sink 11 using a bonding material layer 17, which may include a strap bonding solder, an electroconductive silver paste, a sintering metal material or the like.

The thermal conductivity of the first heat sink 11 is usually very low, so that the thermal resistance (Rjc) from the junction of the chips to the housing of the first heat sink 11 is very low. In addition, the first heat sink 11 has the higher heat capacity. Thus, the performance of the power chip against the thermal shock is very good. In summary, the thermal performance of the first power chip 12 directly assembled to the first heat sink 11 is very good. In addition, due to the presence of the first heat sink 11, the heat of the power module 10 becomes more uniform, which is more advantageous to the thermal management. Of course, only the power chip is described as an example herein.

Because the package type of this embodiment is used inside the power source, the module surface needs not to be totally electro-insulated from the internal circuits in order to achieve the higher space availability and enhance the performance of the power module 10. Thus, the insulation cost is reduced, the space wastage caused by the insulation can be reduced, and the attenuation of the heat dissipating ability can be reduced. In some specific occasions, the first heat sink 11 may be directly utilized as an electroconductive channel. Because the first heat sink 11 is usually made of a good conductor, such as copper, aluminum or the like, and the thickness is relatively thicker, its electroconductive performance is excellent. Thus, it is possible to obtain the better electrical performance, to reduce the generated heat, and thus further improve the thermal performance of the package body. Furthermore, the first heat sink 11 may directly serve as a pin, or may be connected to at least one pin. That is, the pin and the first heat sink 11 may be integrally formed, or the pin is well electrically connected to the first heat sink 11 through wire bonding, welding, strap bonding, conductive adhesive adhering, or the like, so that the good electrical conductor of the surface can be sufficiently utilized. This will significantly reduce the thermal resistance from the device to the first heat sink 11, and may concurrently discover the thermal and electrical abilities of the good electrical conductor of the first heat sink 11. Thus, the space availability can be enhanced, and the power density of the power converter or the efficiency thereof can be advantageously enhanced.

Figure 9:
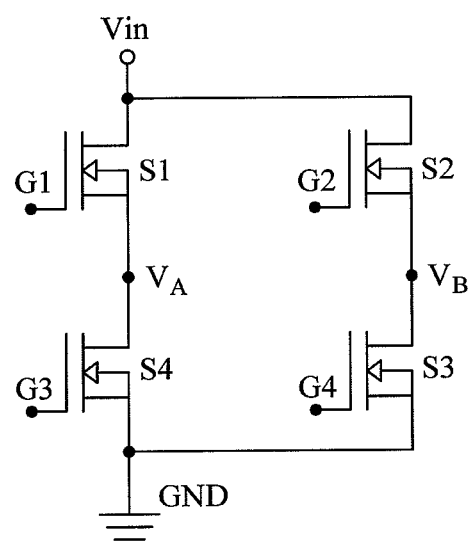
FIGS. 9 and 16 show different aspects of a full-bridge circuit applied to the power module according to the preferred embodiment of the invention.

In the occasions of D2D_Pri, D2D_Sec and the like, a full-bridge circuit is frequently utilized. So, the power module 10 of this embodiment may be used in a full-bridge circuit. FIG. 9 is a schematic illustration showing the full-bridge circuit. In order to satisfy the application, the power module 10 needs to have eight function pins, such as Vin, GND, VA, VB, G1, G2, G3, G4, been arranged.

In order to enhance the performance of the power module 10 and sufficiently discover the potential, the power module 10 must have the two-side heat dissipating ability. In this embodiment, two maximum main surfaces of the power module, a front surface (molding compound 16) A1 and a rear surface (heat sink 11 and molding compound 16) A2, can dissipate heat. Thus, the effective heat dissipating ability can be significantly enhanced, and the self heat dissipation can be conducted without an additional heat sink in the low-loss occasion, so that the internal space availability of the power is significantly enhanced. In order to implement the better heat dissipating property, the molding compound is as thin as possible.

In order to reduce the mechanical stress in use and thus make the module be easily designed to be thin, a predetermined screw mounting hole may be omitted from the power module so that the space availability can be further enhanced. If an additional heat sink has to be mounted, the solution without the screw, such as direct adhering, can be chosen.

Thus, the power module 10 of this embodiment significantly increases the amount of this type of package, and also satisfies the requirements on the current and future power converters. In addition, the space availability of the power converter can be enhanced, and the power density or efficiency of the power source can be enhanced.

In addition, as shown in FIG. 8, the second power chip 14 is disposed on the first heat sink 11 through a thermo-conductive insulating layer 13, and is indirectly placed on the heat sink 11. The thermo-conductive insulating layer 13 may have an insulating layer 132, such as a ceramic sheet for insulation. The thermo-conductive insulating layer 13 may be, for example, a metal substrate or a metalized ceramic substrate, such as a direct bonded copper (DBC) ceramic substrate, a metalized ceramic sheet on which a thick copper circuit layer is mounted, a direct bonded aluminum (DBA) ceramic substrate, an aluminum substrate, a copper substrate, or any other highly thermo-conductive substrate. In this example, the thermo-conductive insulating layer 13 is the DBC substrate, and thermo-conductive insulating layer 13 may include a thermo-conductive layer 131, an insulating layer 132 and a trace layer 133. The thermo-conductive layer 131 and the trace layer 133 may be made of copper, and the insulating layer 132 may be made of the ceramic material.

Taking the frequently used DBC substrate as an example with respect to the existing art, the invention only has a portion of devices (second power chip 14) mounted on the thermo-conductive insulating layer 13. Because the number of devices mounted thereon is decreased, the area of the DBC substrate may also be relatively decreased. Thus, the package material cost can be reduced, and the economic performance of package can be enhanced. Since the DBC area is reduced, the warpage phenomenon caused by the non-uniform coefficients of thermal expansion (CTEs) of the DBC, the heat sink 11 and the molding compound 16 is also eased. This is because the warpage, induced by the adaptation between the CTEs of different materials, becomes more and more severe as the dimensions get larger and larger. Thus, the stress inside the package body can be reduced so that the reliability of the package body is further increased. A portion of devices (e.g., the first power chip 12) has been directly connected to the heat sink 11, the materials of the power module of the invention to be insulated are significantly decreased as compared with the existing arts. Thus, the cost is decreased, the thermal management ability is further enhanced, and the difficulty of the reliability design caused by the mismatch between the CTEs of the materials can be advantageously decreased.

In the actual application, in some occasions where the heat dissipating requirement is very severe, the molding compound 16 with the higher coefficient of heat conductivity (not smaller than 1 W/m·K, preferably greater than 1.2 W/m·K or even 1.8 W/m·K) can be selected. Thus, the heat dissipating ability on one side of the molding compound can be enhanced, the better two-side heat dissipating ability can be implemented, and the heat dissipating ability of the overall package body can be further enhanced.

Figure 10:
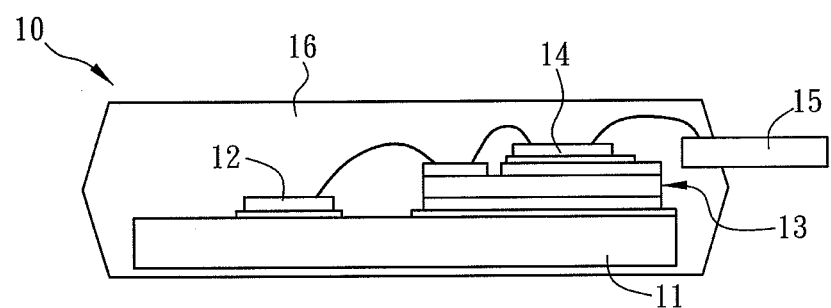
FIGS. 10 to 15 and FIGS. 17 to 26 are schematic illustrations showing different aspects of the power module according to the preferred embodiment of the invention.

FIG. 10 shows another extended application of the package type, wherein the insulation processes may be performed on the surface of the heat sink, so that the first heat sink 11 is entirely covered by the molding compound 16, and either surface of thereof cannot be exposed to the outside, or the heat sink 11 is isolated from the outside through an insulation body so that it can be used in the occasion where the insulation is desired.

Figure 11:
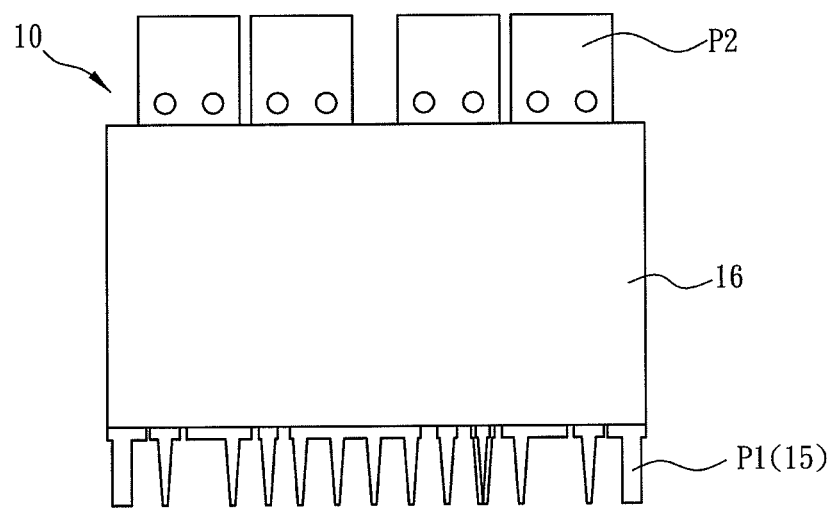

In order to extend the package type of the power module to more occasions, it can be configured to have two rows of pins, as shown in FIG. 11. When the internal circuit is too complicated and more pins are needed, one row of pins P2 may be added to the features mentioned hereinabove. If this package type is applied to the occasion where the single-row of pins P1 are sufficient, then the upper row of pins P2 may be configured to have the heat dissipating usage.

As well known in the art, the electromagnetic radiation caused by more voltage trip points inside the power source becomes stronger, thereby bringing the difficulty for the power electromagnetic compatibility. The heat sink 11 of the invention has the electric property and has the relatively large area, thereby bringing the hidden danger to the electromagnetic radiation. However, if the electric property of the heat sink 11 is optimized, the heat sink 11 may be possibly designed as the mask layer for electromagnetic radiation, which is further advantageous to the electromagnetic compatibility. For example, the heat sink 11 may be connected to a voltage static location. That is, the potential is quiet and has the less noise relatively to the earth. For example, Vin and GND of FIG. 9 are quieter relatively to other voltage points. The heat sink 11 designed to be Vin or GND is advantageous to the electromagnetic compatibility. In the actual operation, however, only one electrode is formed on the surface of the power chip (the first power chip 12 in this embodiment) to be connected to the heat sink 11 in order to facilitate the implementation. In the MOSFET, for example, the voltage between its drain and its source is usually higher than the voltage between the gate and the source. So, the source and the gate of the device often share one surface, while the drain often occupies one surface. Thus, the power chip (first power chip 12) with the drain serving as the ground is directly connected to the heat sink 11, so that the electromagnetic compatibility may be well proceeded, and the manufacturing processes also become convenient.

Figure 12:
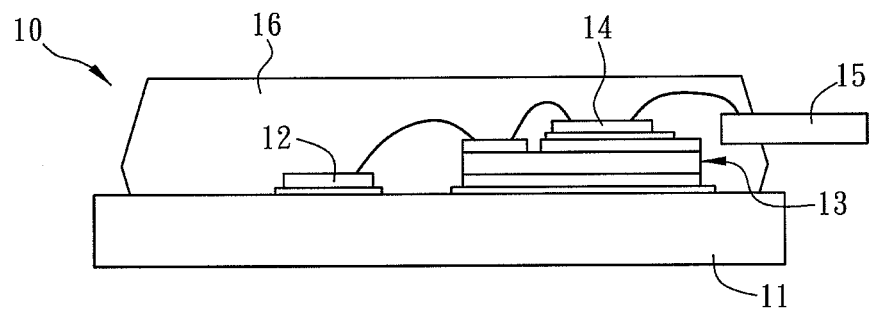

As shown in FIG. 12, the heat sink 11 on the backside may be broaden/lengthened, or even curved, so that it partially exceeds the portion covered by the molding compound 16, and the surface area is enlarged. The two surfaces of the heat sink 11 that are not covered by the molding compound 16 can exchange the heat with the environment. Thus, the heat dissipating performance of the power module 10 may be further enhanced.

Figure 13:
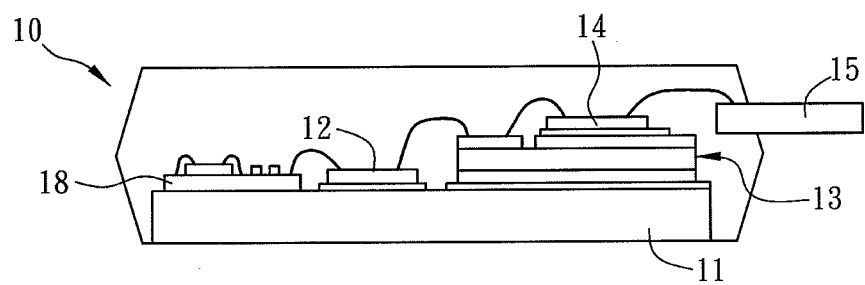

As shown in FIG. 13, in some occasions, some power semiconductor devices have to be installed in the package body, and some control functions have to be integrated within the package body. The control wires are usually more complicated, and the substrate, such as the PCB substrate or IC, having the higher layout density has to be used. In this aspect, the controller 18 (e.g., the high density layout board or the control IC) carrying the control wire can be packaged within the package body.

Figure 14:
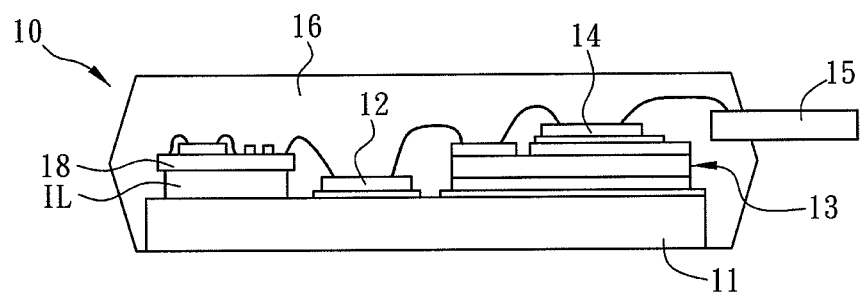

In FIG. 14, the controller 18 may be a high density substrate having the smaller coefficient of heat conductivity but the higher layout density, so that more control functions may be integrated. The controller 18 has the temperature tolerance level lower than that of the power chip. Thus, a heat insulating layer IL, having the thermal conductivity usually lower than 0.5 W/m·K), is disposed between the controller 18 and the heat sink 11. Thus, the temperatures of the controller 18 and the devices mounted thereon may be lowered.

Figure 15:
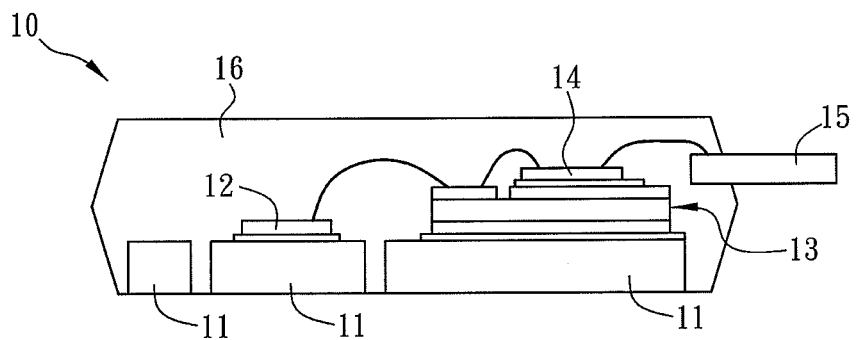

In FIG. 15, the heat sink 11 mentioned hereinabove is not restricted to a complete block, and may be further divided according to the requirement to form some circuit patterns. That is, the heat sink 11 may also have many electrodes. Thus, the flexibility of designing the power module can be further enhanced.

Figure 16:
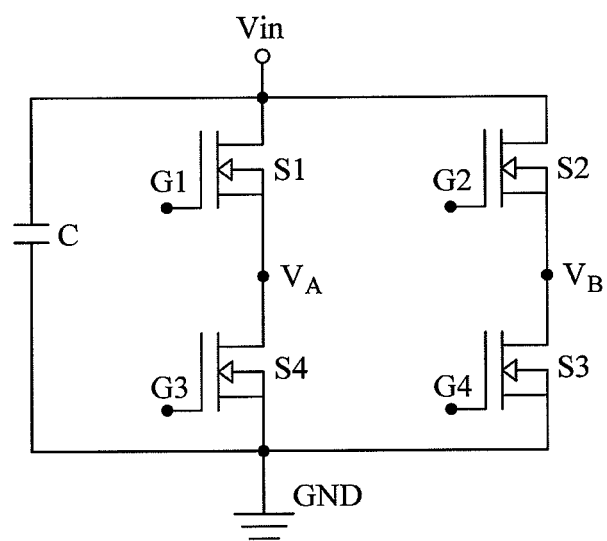

In the power module 10, multiple devices are integrated together, and current flowing loops are significantly reduced as compared with the independent devices. Thus, the loop inductance and thus the loss are reduced, and the voltage noise is further reduced. However, optimization may be continued. As shown in FIG. 16, taking the full-bridge circuit as an example, an additional high-frequency capacitor C is integrated within the power module 10 to further decrease the loops and reduce the loop inductance.

For the security consideration, the power converter usually immediately monitors the temperature state of the power semiconductor. If the temperature is too high or the temperature rising speed is too fast, the circuit may be dangerous and a prevention action, including shutting down the power, may be adopted in advance. The temperature detection of the independent device may be achieved only by adding a temperature sensor to the outside. So, the internal temperature state cannot be immediately reflected, and the mounting of the temperature sensor is more complicated. Thus, a temperature sensor may further be integrated within the power module so that the temperature monitoring effect is enhanced, and the use can be simplified.

Figure 17:
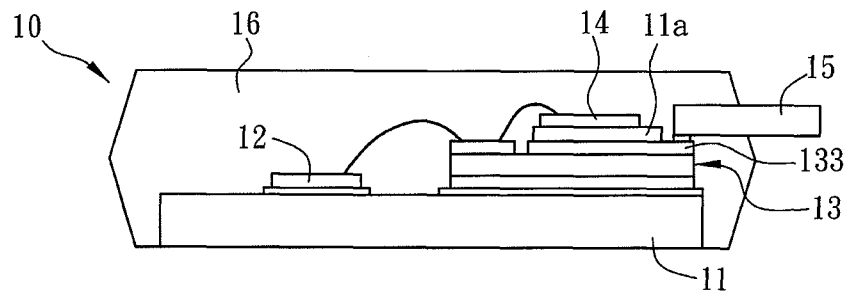

As shown in FIG. 17, the power module of this aspect further includes a second heat sink 11a disposed between the second power chip 14 and the thermo-conductive insulating layer 13. When the power chip is working, it may encounter, for example, the transient impact greater than several times of the normal working current. So, the heat sink 11a can improve the ability of the element against the thermal shock without enlarging the area of the thermo-conductive insulating layer 13 (DBC), wherein the element is mounted on the DBC substrate and needs to withstand the thermal shock. In addition, the lead frame 15 is extended and connected to the trace layer 133 of the thermo-conductive insulating layer 13.

Figure 18:
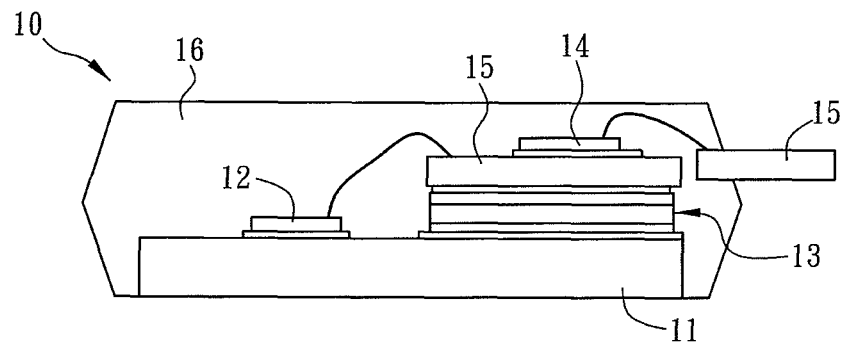
Figure 19:
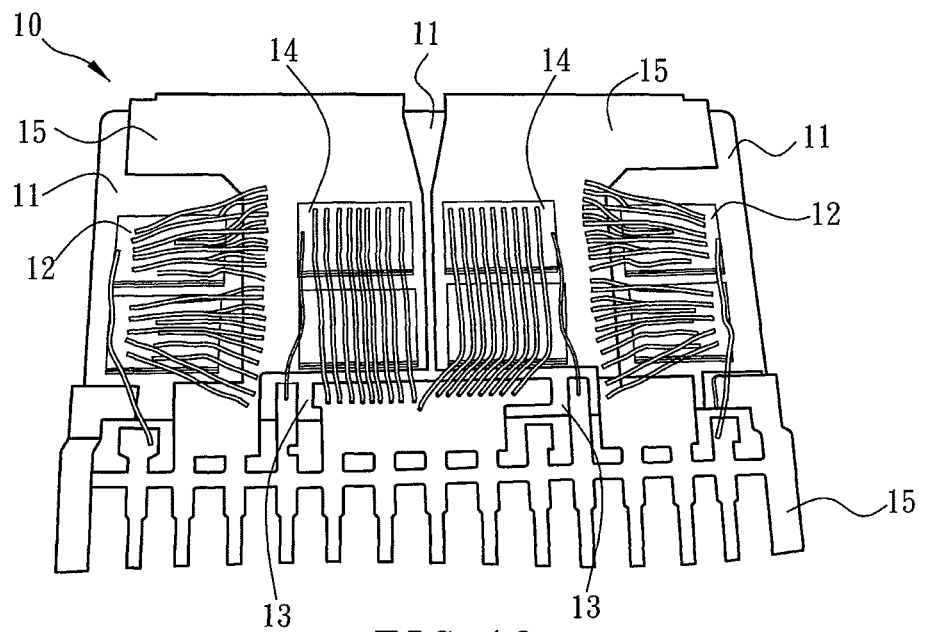

As shown in FIG. 18, in order to improve the thermal shock resisting performance of the element (e.g., the second power chip 14), which is mounted on the thermo-conductive insulating layer 13 (e.g., DBC substrate) and generates more heat, and to improve the ability of the trace of withstanding the current on the DCB substrate, the current conducting impedance is reduced. The area of the lead frame 15 may further be enlarged, and the lead frame 15 may be bonded to the trace layer of the DBC substrate through an electroconductive material. The photo of a real object of the power module developed according to this structure is shown in FIG. 19, wherein the power module is not covered by the molding compound. The DBC substrate is bonded to the heat sink 11 by way of strap bonding, and the lead frame 15 is electrically and mechanically connected to the trace layer of the DBC substrate by way of strap bonding. The DBC substrate used in the power module 10 of FIG. 19 has the trace layer with the thickness of 0.3 mm, while the lead frame 15 has the thickness of 0.5 mm. Thus, the conducting resistance of this structure is reduced by more than 60% as compared with the structure, in which the chip is directly bonded to the trace layer of the DBC substrate. Thus, the heat generated by the module can be effectively reduced, the electric performance of the module can be enhanced, and the heat dissipating performance of the module can be improved.

Figure 20:
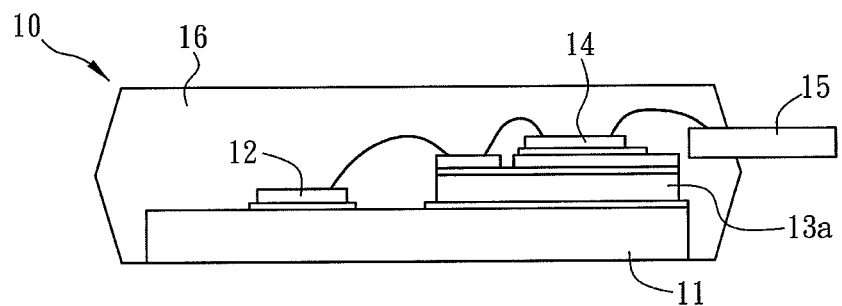

As shown in FIG. 20, in addition to the DBC substrate with the good thermo-conductive ability, another substrate, such as a copper substrate 13a, similarly having the better thermo-conductive ability may also be used in the power module 10. In the structure of the typical copper substrate, an insulating layer and a thin copper trace layer are formed on a thicker copper substrate. In addition, the numbers of the insulating layer(s) and the thin copper trace layer(s) are not restricted to one, and multiple layers may be adopted. In some occasions, the higher layout density can be implemented.

Figure 21:
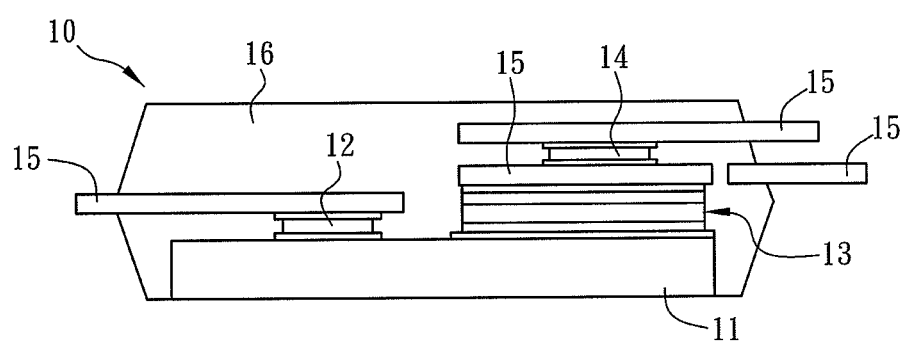

In general, signals are transmitted between the first power chip and the second power chip through wires formed by way of wire bonding. Because the wires are usually aluminum wires, the internal resistance thereof is very large. If the gold (Au) wires are adopted, the cost is too high. Although the copper (Cu) wires have been disclosed in the latest technique, the internal resistance is still very large. As shown in FIG. 21, in order to reduce the loss caused by the internal resistance of the package, the wireless bond technique may be adopted in this invention. For example, copper sheets, instead of bonded wires, may be adopted to implement the current transfer, so that the internal resistance of the package is greatly decreased, and the cost thereof will not be too high. In this aspect, the lead frame 15 is extended to be connected to at least one of the first power chip 12 and the second power chip 14 to replace the wire.

Figure 22:
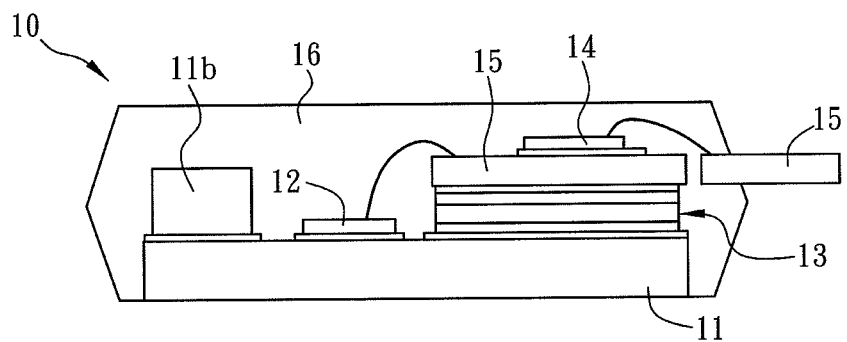
Figure 23:
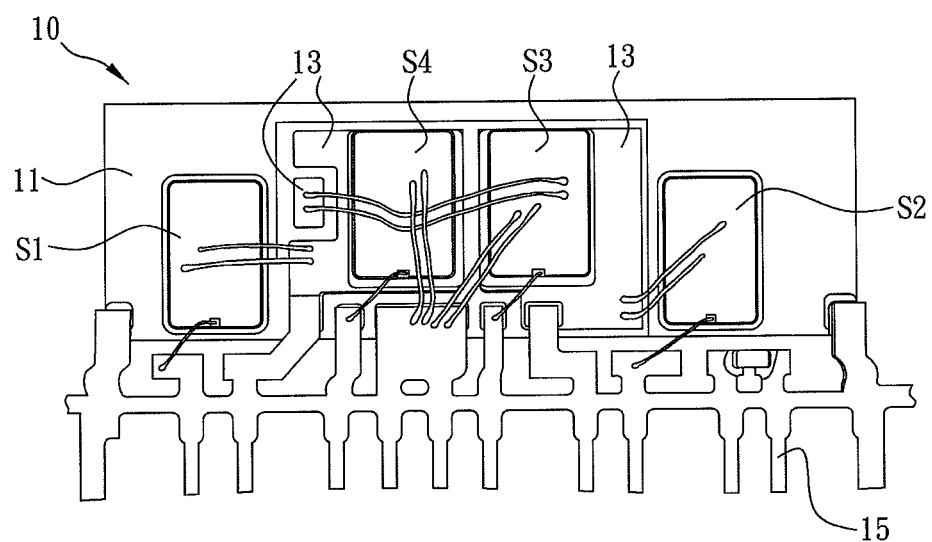

FIG. 22 shows a solution for further improving the heat transfer ability. The power module of the invention usually has some devices (e.g., the first power chip 12) directly connected to the heat sink 11, and the insulation element (e.g., the thermo-conductive insulating layer 13 with the insulating layer) is disposed between some devices (e.g., the second power chip 14) and the heat sink 11, thereby causing the non-uniform thickness of the overall module. That is, the distance from the local molding compound 16 to the device becomes thicker so that the temperature of the molding compound 16 becomes non-uniform and the heat dissipating ability of the surface of the molding compound 16 is thus affected. In FIG. 22, a third heat sink 11b, which is the good thermo-conductor disposed in the first area of the first heat sink 11, is added to the thicker portion of the molding compound 16. The thickness from the molding compound 16 to the device is homogenized to improve the heat dissipating ability.

Figure 25:
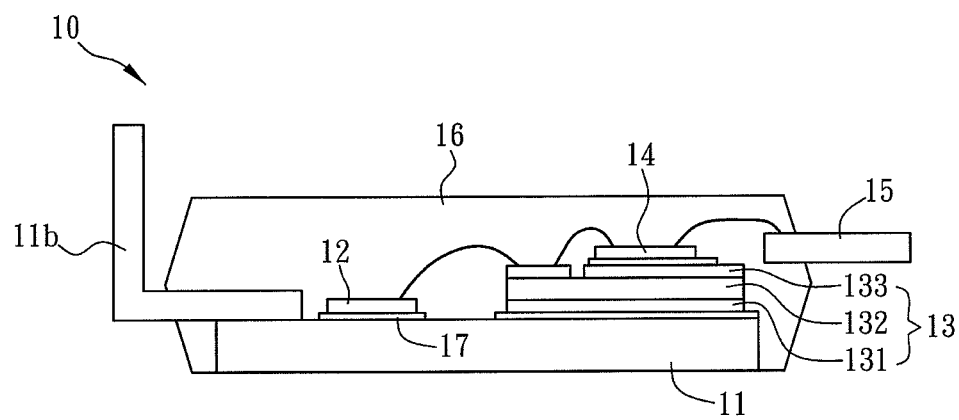

In addition, as shown in FIG. 25, the third heat sink 11b penetrates through the molding compound 16 and has a bend. The third heat sink 11b penetrating through the molding compound 16 may serve as a pin, simply dissipate the heat, or partially serve as the pin and partially dissipate the heat. The third heat sink 11b can decrease the dimension of the upright power module 10 through the bend.

Figure 26:
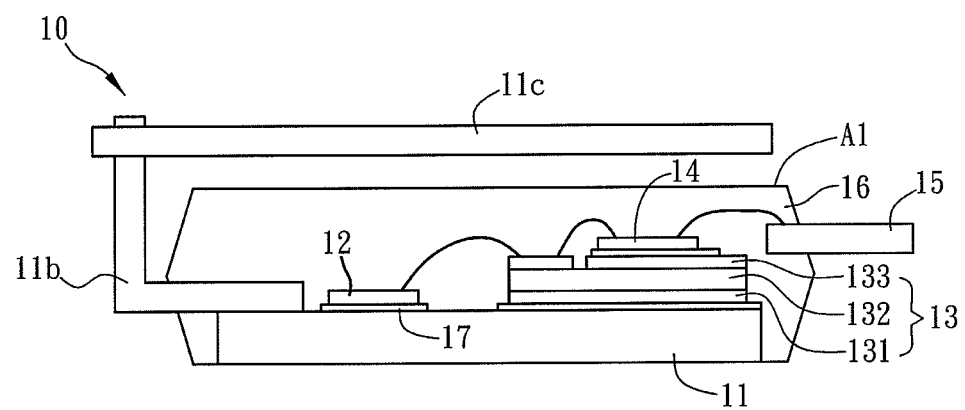

In the actual application, if the heat dissipating ability is to be further expanded, the method of FIG. 26 may be adopted. That is, a fourth heat sink 11c is further mounted on the third heat sink 11b of the power module 10. The fourth heat sink 11c may be connected to the third heat sink 11b by way of bonding, adhering or the like. Because the mounting is simple, the shape and the position of the fourth heat sink 11c are not restricted. For the actual effect, however, it is preferred to keep the heat dissipating ability on the surface of the power module 10. That is, as shown in FIG. 26, a gap is kept between the fourth heat sink 11c and the front surface A1 of the power module 10 so that the air stream may flow in the gap, and the front surface of the power module and the lower surface (near the front surface A1) of the fourth heat sink 11c can have the predetermined heat dissipating functions. In order to make the air stream flowing in the gap reach the predetermined level, the thickness of the gap may be greater than 1 mm, and preferably greater than 2 mm.

Figure 24A:
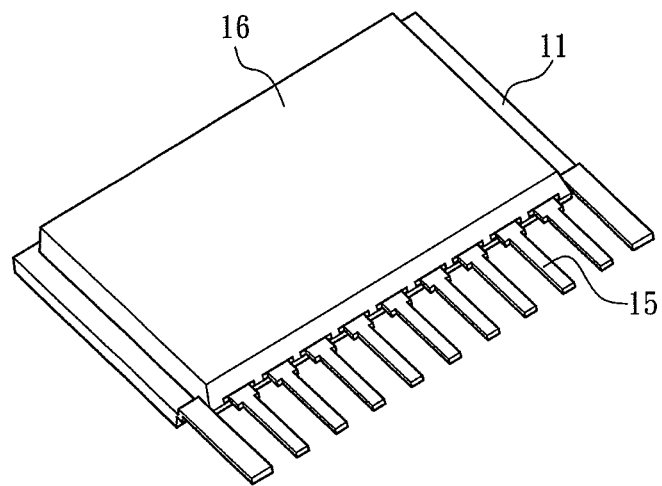
Figure 24B:
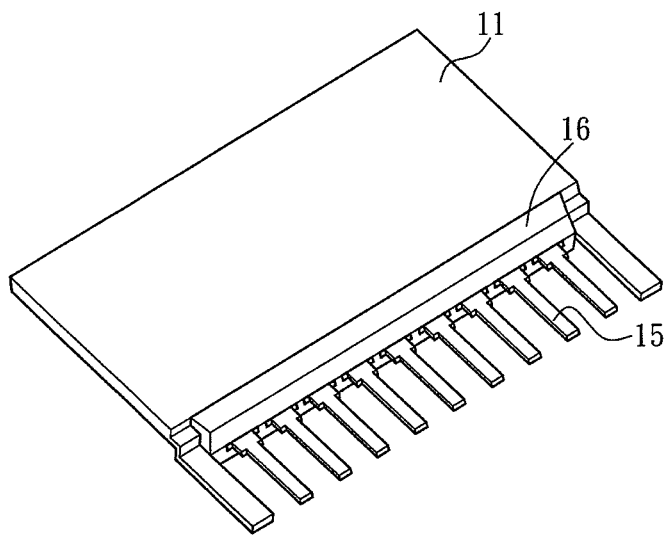
Figure 24C:
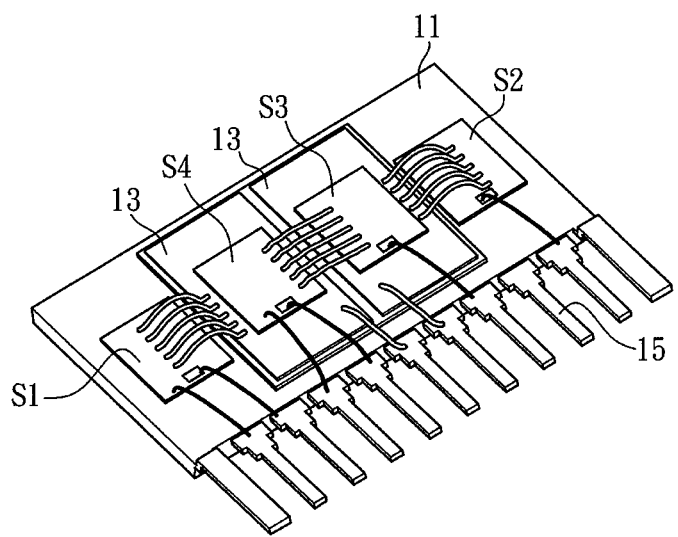
Figure 24D:
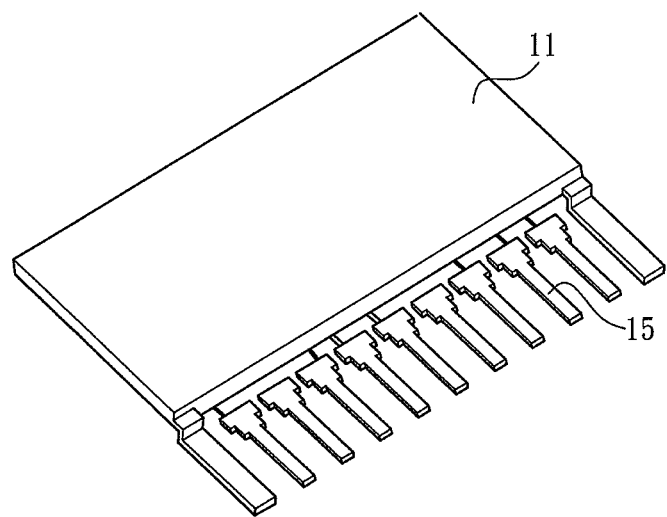

In order to explain the meanings of the invention more sufficiently, illustrations will be described with the aid of the full-bridge circuit. As mentioned hereinabove, FIG. 9 shows the topology of the full-bridge circuit, and FIGS. 23 and 24A to 24D are schematic illustrations showing the internal structure and the three-dimensional structures of the power module. FIG. 24A is a schematic front view showing the power module 10, FIG. 24B is a schematic rear view showing the power module 10, FIG. 24C is a schematic front view showing the power module 10 with the molding compound 16 being removed, and FIG. 24D is a schematic rear view showing the power module 10 with the molding compound 16 being removed.

In the above-mentioned embodiment, the first power chip 12 and the second power chip 14 are illustrated as a non-restrictive example, the first power chip 12 represents that it is disposed on the heat sink 11, and the second power chip 14 represents that it is disposed on the heat sink 11 through the thermo-conductive insulating layer 13. In the following illustrations, two first power chips S1 and S2 and two second power chips S3 and S4 will be described.

Referring to FIG. 9, the full-bridge circuit includes four switch devices S1 to S4, each of which is a MOSFET, for example. The four switch devices constitute two electroconductive bridge arms, wherein S1 and S4 constitute one bridge arm, and S2 and S3 constitute the other bridge arm. The drains of the upper switch devices S1 and S2 of the bridge arms are commonly connected to a high voltage point Vin. In the D2D application, the electric end Vin is a DC input terminal, and has a voltage waveform that is a stable DC or a DC with little ripples). The sources of the lower switch devices S3 and S4 of the bridge arms are commonly connected to the low voltage point GND. In a single bridge arm, the source of the upper switch device is connected to the drain of the lower switch device. For example, the bridge arm (S1 and S4) is connected to VA, and the bridge arm (S2 and S3) is connected to VB. The working principle is that the upper and lower switch devices of the bridge arm complementarily turn on (e.g., S1 is on while S4 is off; S1 is off while S4 is on), wherein S1 and S4 are off in a short period of time during the switch-state converting process. In the occasion of the D2D application, DC exists between the input terminals Vin-GND, while the voltage at the contact point VA/B at the middle of the bridge arm is varied between two amplitude values of 0 and Vin corresponding to the switching operations.

At present, the most typical method of extracting electrodes in the high power MOSFET is as follows: the drain is disposed on the backside of the chip, and the source and gate are distributed on the front side of the chip, wherein the gate has the smaller dimension, such as 1 mm*1 mm. The strap bonding process is usually performed on the drain on the backside of the chip in advance, while the source and gate on the front side are usually the aluminum metalized electrodes, which may be connected to the peripheral circuit by way of aluminum/gold wire bonding. The drains of the switch devices S1 and S2 are connected to the common DC potential point Vin. So, the switch devices S1 and S2 may be directly strap-bonded to the heat sink 11, while the pin of Vin electrically connected to the external device may be directly strap-bonded to the heat sink 11. Thus, the electrical conduction is achieved using the heat sink 11 with the excellent electro-conductive property, thereby reducing the electricity loss and the heat generated by the package body. Thus, the best thermal and electric performance may be obtained. In the existing power module, all the four MOSFETs are mounted on the DBC substrate and then the electrical connections between all the MOSFETs and the lead frame are implemented by wire bonding according to the conventional method mentioned hereinabove. As discussed hereinabove, the advantages of the invention becomes obvious as compared with various defects (poor heat dissipating ability, poor electric performance, high price, poor reliability and the like) of the existing arts.

The application of the invention further has the effect of reducing the electromagnetic interference (EMI) according to the basic working principle of the full-bridge circuit. The heat sink 11 connected to the DC input terminal Vin, which is a good static potential point, while the contact points VA and VB at the middle of the bridge arm are the voltage trip points. A large piece of heat sink 11 may effectively block the transfer of the trip signal. Thus, the interference of the trip point on the peripheral circuit may be effectively decreased, and the test EMI can be decreased.

As mentioned hereinabove, in order to possess the better EMC property and the better heat dissipating performance, the switch devices S3 and S4 in the full-bridge module are placed on the insulating layer (i.e., the insulating layer of the thermo-conductive insulating layer), and the switch devices S1 and S2 are directly placed on the heat sink 11. In order to facilitate the production and decrease the space wastage caused by the production tolerance, the switch devices S3 and S4 are placed on the insulating layers connected together. In order to decrease the loop inductance and facilitate the usage, the device S2 is disposed on the outside of the device S3, and the device S1 is disposed on the outside of the device S4. That is, for the full-bridge circuit of FIG. 9, the devices inside the module are preferably arranged in the order of S2-S3-S4-S1 or S1-S4-S3-S2 so that the performance becomes better.

The method of manufacturing the power module of this embodiment will be described in the following. In this example herein, the thermo-conductive insulating layer is a direct bonded copper ceramic substrate. In addition to a power chip (semiconductor chip), the power module is further integrated with some passive devices, such as a resistor and a capacitor, and a temperature measuring resistor is further mounted on some pins on the lead frame to provide the function of over-temperature protection for the module. The specific manufacturing processes are as follows. First, the soldering paste is applied to the position of the heat sink 11 where the thermo-conductive insulating layer 13 is to be mounted, and the position to be connected to the lead frame 15. Similarly, the soldering paste is applied to the position of the thermo-conductive insulating layer 13 where the lead frame 15 is to be assembled. Thereafter, the heat sink 11, the thermo-conductive insulating layer 13 and the lead frame 15 are placed in a jig according to the set assembling relationship. Then, the jig is placed in a reflow oven so that the heat sink 11, the thermo-conductive insulating layer 13 and the lead frame 15 may be bonded together to form an entity. In the subsequent seeding process, the lead frame 15 may be applied for transmission and positioning. After the flux cleaning, the required semiconductor devices (e.g., MOS and diode) are mounted by way of seeding. Herein, it is to be emphasized that a portion of power chips (e.g., the first power chip 12) is placed on the heat sink 11, and the other portion of the power chips (e.g., the second power chip 14) is placed on the thermo-conductive insulating layer 13. The connection interface material used for seeding is also the soldering paste. When the seeding machine with the single function is used, surface mount technology (SMT) operations still have to be performed on some devices, such as resistors, capacitors or the like, because the seeding machine does not have the ability of grasping the SMT devices. That is, after the soldering paste is dispensed, other element devices (SMT) are placed. Because the used power chip has the larger dimension, the bonding layer formed by reflowing the soldering paste may have the higher porosity to cause the problem of the poor technology and reliability. Herein, the vacuum reflow is adopted to bond the elements to the heat sink 11, the thermo-conductive insulating layer 13, the lead frame 15, the chip, the SMT devices. After the flux cleaning, wire bonding processes are performed. The main process is completed after packaging (molding or other metal/ceramic packaging processes).

In some applications where the seeding process does not need the lead frame 15 for positioning, the technological process may be possibly simplified. First, the soldering paste is applied to required positions on the heat sink 11, the thermo-conductive insulating layer 13 and the lead frame 15. Then, the required elements (power chip and passive SMT element) are respectively disposed at the required positions. This step may be implement by the generally powerful machine (e.g., the machine with the integrated seeding and surface mount technology functions) in one station, and may also be implemented through many machines, and the used connection interface material may be the soldering paste. Thereafter, the heat sink 11, the thermo-conductive insulating layer 13 and the lead frame 15, on which the elements are placed, are placed into a jig according to the set assembling relationship to complete the assembly. Then, the vacuum reflow is performed. The subsequent techniques are the same as those in the above-mentioned processes. Thus, the number of times of reflow and the corresponding cleaning processes can be decreased. Because the number of times of reflow is decreased, the reliability of the module can be advantageously enhanced.

Of course, the soldering paste may also be replaced with a solder sheet, a conductive adhesive, a low-temperature sintering nano-silver paste or the like, to serve as the interface material of the electrical/mechanical connections when the module is assembled. In some occasions, more than one connection interface material may even be used at different assembling positions in the same module assembling process. When these connection materials are used, the assembling technique and flow also need to be correspondingly adjusted.

When the front-side electrode of the chip is extracted, other methods other than wire bonding may also be adopted. For example, an adhering/bonding metal (copper) sheet may be adopted to implement the interconnection between the front-side electrode and the external trace.

In summary, with the package method and structure of the invention capable of enhancing the power density or efficiency of the power converter, it is possible to obtain the better thermal performance, electric performance, economic performance, EMC performance and the higher reliability as compared with the prior art. The internal space availability of the power module is very high, and the power module can be conveniently used so that the power density or efficiency of the converter can be advantageously enhanced. The invention provides the specific implementation for the power module, which is quite practical and effective. The invention is very suitable for the enhancement of the overall performance of the power converter and the cost effectiveness.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A power module, comprising:
   a first heat sink having a first area and a second area;
   a first power chip disposed in the first area;
   a thermo-conductive insulating layer disposed in the second area, wherein the thermo-conductive insulating layer includes a thermo-conductive layer, an insulating layer and a trace layer;
   a second power chip disposed on the first heat sink through the thermo-conductive insulating layer, wherein the first power chip and the second power chip have at least two electrodes, respectively, and the second power chip is a vertical-type power chip;
   a lead frame electrically connected to at least one of the electrodes of the first power chip and the second power chip respectively to form at least two pins; and
   a molding compound covering the first power chip, the thermo-conductive insulating layer, the second power chip and a portion of the lead frame,
   wherein one of the electrodes of the second power chip is directly connected to the trace layer of the thermo-conductive insulating layer,
   wherein the first heat sink is electrically connected to the first power chip and form a common connection point, the common connection point of the first heat sink and the first power chip is a voltage static location.

2. The power module according to claim 1, further comprising:
   a bonding material layer, through which the first power chip is connected to the first heat sink, wherein the bonding material layer is made of a thermo-conductive and electro-conductive material.

3. The power module according to claim 2, wherein the first heat sink and the lead frame are integrally formed as one piece.

4. The power module according to claim 2, wherein the first heat sink is entirely disposed within molding compound, partially outside the molding compound or entirely outside the molding compound.

5. The power module according to claim 2, wherein the pins penetrate through the molding compound.

6. The power module according to claim 2, wherein the first heat sink is divided into a plurality of portions.

7. The power module according to claim 2, wherein the lead frame extends and is connected to the trace layer.

8. The power module according to claim 2, wherein the lead frame extends and is connected to at least one of the first power chip and the second power chip.

9. The power module according to claim 2, further comprising:
   a second heat sink disposed between the second power chip and the thermo-conductive insulating layer.

10. The power module according to claim 2, further comprising:
    a third heat sink, which is disposed in the first area or is formed by extending the first heat sink.

11. The power module according to claim 10, wherein the third heat sink penetrates through the molding compound.

12. The power module according to claim 10, wherein the third heat sink penetrates through the molding compound and has a bend.

13. The power module according to claim 11, further comprising:
    a fourth heat sink connected to the third heat sink, wherein a gap is formed between the fourth heat sink and the molding compound.

14. The power module according to claim 2, wherein the thermo-conductive insulating layer is a metal substrate or a metalized ceramic substrate.

15. The power module according to claim 2, further comprising one row of pins penetrating through the molding compound and functioning to transmit a signal or dissipate heat.

16. The power module according to claim 2, further comprising:
a controller disposed in the first area.

17. The power module according to claim 16, further comprising:
a heat insulating layer disposed between the controller and the first heat sink.

18. The power module according to claim 2, further comprising:
a high-frequency capacitor integrated within the power module.

19. The power module according to claim 2, further comprising:
a temperature sensor integrated within the power module.

20. The power module according to claim 2, wherein at least one of the first and second power chips has at least three electrodes.

21. The power module according to claim 20, further comprising:
at least one power chip, wherein at least two of the power chips contained in the power module have at least three electrodes.

22. The power module according to claim 2, wherein the molding compound has a coefficient of heat conductivity higher than 1.2 W/m·K.

23. The power module according to claim 2, wherein the molding compound has a coefficient of heat conductivity higher than 1.8 W/m·K.

24. A method of manufacturing a power module, comprising:
an assembling step of assembling a first heat sink, a thermo-conductive insulating layer and a lead frame using a connection interface material according to a set assembling relationship, wherein the thermo-conductive insulating layer covers a first area of the first heat sink, and the thermo-conductive insulating layer includes a thermo-conductive layer, an insulating layer and a trace layer;
a seeding and front-side electrode extracting step of disposing a first power chip in a second area of the first heat sink through the connection interface material, and disposing a second power chip on the thermo-conductive insulating layer through the connection interface material, wherein the first power chip and the second power chip have at least two electrodes, respectively, and the second power chip is a vertical-type power chip, the first heat sink is electrically connected to the first power chip and form a common connection point, the common connection point of the first heat sink and the first power chip is a voltage static location, one of the electrodes of the second power chip is directly connected to the trace layer of the thermo-conductive insulating layer, and the lead frame is electrically connected to at least one of the electrodes of the first power chip and the second power chip, respectively;
an encapsulating step of covering the first power chip, the thermo-conductive insulating layer, the second power chip and a portion the lead frame by a molding compound.

25. The method according to claim 24, wherein in the assembling step, the connection interface material is applied to a position, where the thermo-conductive insulating layer is assembled onto the heat sink, a position where the heat sink is connected to the lead frame, and a position where the thermo-conductive insulating layer is to be assembled onto the lead frame.

26. The method according to claim 24, wherein the connection interface material is a soldering paste, a solder sheet, a conductive adhesive or a low-temperature sintering nano-silver paste.

27. The method according to claim 24, wherein the front-side electrode extracting step is to wire-bond or adhere/bond a metal sheet.

* * * * *